(12) United States Patent
Arora et al.

(10) Patent No.: US 6,599,372 B2
(45) Date of Patent: Jul. 29, 2003

(54) SOLDERING FLUX

(75) Inventors: Sanyogita Arora, North Arlington, NJ (US); Alvin F. Schneider, Warren, NJ (US); Karen A. Tellefsen, Millington, NJ (US)

(73) Assignee: Fry's Metals, Inc., Jersey City, NJ (US)

( * ) Notice: Subject to any disclaimer, the term of this patent is extended or adjusted under 35 U.S.C. 154(b) by 17 days.

(21) Appl. No.: 09/728,264

(22) Filed: Dec. 1, 2000

(65) Prior Publication Data

US 2001/0042775 A1 Nov. 22, 2001

Related U.S. Application Data

(60) Provisional application No. 60/168,689, filed on Dec. 3, 1999, and provisional application No. 60/179,202, filed on Jan. 31, 2000.

(51) Int. Cl.$^7$ ............................................. B23K 35/363
(52) U.S. Cl. ........................ 148/23; 148/24; 219/85.15
(58) Field of Search ................... 148/23, 24; 219/85.15

(56) References Cited

U.S. PATENT DOCUMENTS

| | | | |
|---|---|---|---|
| 3,674,896 A | * | 7/1972 | Purcell et al. .......... 260/897 B |
| 3,895,973 A | * | 7/1975 | Stayner ........................ 148/25 |
| 3,963,529 A | * | 6/1976 | Tsunashima ................. 148/25 |
| 4,009,816 A | | 3/1977 | Feuchtbaum et al. ....... 228/207 |
| 4,092,182 A | | 5/1978 | Arbib et al. .................. 148/25 |
| 4,143,005 A | | 3/1979 | Packer ......................... 260/17 |
| 4,243,440 A | | 1/1981 | Arbib et al. .................. 148/23 |
| RE30,696 E | | 8/1981 | Arbib et al. .................. 148/23 |
| 4,380,518 A | | 4/1983 | Wydro, Sr. ................... 264/13 |
| 4,429,457 A | * | 2/1984 | Noguchi et al. .............. 29/840 |
| 4,441,924 A | | 4/1984 | Arbib ............................ 75/65 |
| 4,472,537 A | | 9/1984 | Johnson et al. ............. 523/160 |
| 4,895,606 A | * | 1/1990 | Jafri ............................. 148/25 |
| 4,994,119 A | | 2/1991 | Gutierrez et al. ............. 148/23 |
| 5,004,509 A | | 4/1991 | Bristol ......................... 148/23 |
| 5,127,571 A | | 7/1992 | Gutierrez et al. ........... 228/179 |
| 5,176,759 A | * | 1/1993 | Taguchi ....................... 148/24 |
| 5,211,764 A | | 5/1993 | Degani ......................... 148/25 |
| 5,297,721 A | | 3/1994 | Schneider et al. ........ 228/180.1 |
| 5,507,882 A | | 4/1996 | Bristol et al. ................. 148/23 |
| 5,538,175 A | | 7/1996 | Massini, Jr. et al. ........ 228/102 |
| 5,568,894 A | | 10/1996 | Gileta ......................... 228/219 |
| 5,571,340 A | | 11/1996 | Schneider et al. ............ 148/23 |
| 5,688,356 A | | 11/1997 | Sagiv ....................... 156/331.7 |
| 5,844,309 A | | 12/1998 | Takigawa et al. ............ 257/701 |
| 5,863,355 A | | 1/1999 | Ohno et al. ................... 148/26 |
| 5,869,209 A | | 2/1999 | Shimizu et al. ................ 430/1 |
| 5,941,444 A | | 8/1999 | Sadler et al. .................. 228/33 |
| 6,075,080 A | * | 6/2000 | Katsuoka et al. ........... 524/272 |
| 6,085,960 A | | 7/2000 | Kim et al. .................... 228/37 |
| 6,119,915 A | | 9/2000 | Thompson, Sr. ............. 228/37 |
| 6,159,304 A | * | 12/2000 | Noguchi et al. .............. 148/23 |
| 6,220,501 B1 | * | 4/2001 | Tadauchi et al. ............ 228/208 |

FOREIGN PATENT DOCUMENTS

| | | |
|---|---|---|
| CA | 2123615 | 5/1994 |
| GB | 2 071 550 A | 9/1981 |

OTHER PUBLICATIONS

Condensed Chemical Dictionary (CDC), 10$^{th}$ ed., Van Norstrand Reinhold Company, pp. 891, 900; 1981.*
Patent abstract for JP 7310008 A, Database WPI, Derwent Info., Ltd., WPI Acc. No.: 96–045479/199605 (1996).
Patent abstract for JP 62199289 A, Database WPI, Derwent Info., Ltd., WPI Acc. No.: 87–287295/198741 (1987).
Product data sheet for PENTALYN® H–55WBX Synthetic Resin Dispersion, Hercules Incorporated (1999).

* cited by examiner

*Primary Examiner*—Daniel J. Jenkins
(74) *Attorney, Agent, or Firm*—Mintz, Levin, Cohn, Ferris, Glovsky and Popeo, P.C.

(57) ABSTRACT

A soldering flux includes a resin in an aqueous composition. The flux can also include an activating agent and a surface-active agent that promotes surface wetting. The flux can be used to coat circuits and a printed circuit board. The resin can be non-acidic and/or in an emulsified form.

29 Claims, No Drawings

SOLDERING FLUX

RELATED APPLICATIONS

This application claims the benefit of the following U.S. provisional applications: Ser. No. 60/168,689, filed Dec. 3, 1999, and Ser. No. 60/179,202, filed Jan. 31, 2000, the entire teachings of both of which are incorporated herein by reference.

BACKGROUND

Electronics products, such as computers and communications equipment, employ printed wiring boards (PWB's), or printed circuit boards (PCB's, the two terms used interchangeably throughout). During the assembly of a PCB, components, such as integrated circuits, connectors, dual in-line packages, capacitors and resistors, are soldered to conductive contacts that form part of a circuit-interconnecting pattern on the board. In a solder wave process, components can be mounted on the bottom side of the board with adhesive if they are lead less and on the top of the board via through-holes if the components are leaded wherein leads of a component are passed through a plated through hole in the board. Portions of the leads that protrude through the back or underside of the board are then crimped over and secured to the board with solder that is applied as a molten "solder wave" across the underside of the board. The solder that is thereby applied to the board forms a bond and electrical connection between the surfaces of the component leads and the contacts on the board.

Prior to the actual soldering of such assemblies, a flux is ordinarily applied to the surfaces to be joined to chemically prepare the surfaces to receive the solder. The flux removes and prevents formation of oxides on the surfaces and thereby promotes wetting and continuity of the solder at its interface with the circuit. Consequently, the quality and integrity of electrical and mechanical connections between adjoining surfaces are likewise promoted. Typically, the flux is applied by spray, wave or foam. The fluxed assembly is then pre-heated prior to soldering to volatilize the flux carrier from the surfaces of the PCB.

Soldering fluxes that have been used by the electronics industry in the wave soldering of printed wiring assemblies have traditionally included ingredients that are detrimental to the environment and/or that necessitate the use of post-soldering cleaning agents, which also present undesirable environmental risk. For example, typical resin/rosin-containing fluxes are solvent based (e.g., isopropyl alcohol based), wherein the solvent generally volatilizes in the form of volatile organic compounds (VOC's) that pollute the environment and that may also harm the ozone layer.

As the environmental consequences of electronics production processes have become better understood, and in order to meet increasingly strict government regulations, the art has sought to avoid the above-described problems by proposing water-based fluxes that include acidic rosin. To improve the solubility of the acidic rosin in water, a volatile basic compound, such as ammonia or an amine, is incorporated into the composition.

SUMMARY

The soldering flux described herein can be used for flux coating when soldering electronic assemblies such as printed wiring assemblies. The flux is an aqueous composition that includes a resin.

The flux can be substantially free of volatile organic compounds such as solvents and amines. In addition to the water and resin, the flux can further include activating agent(s) such as organic acids (e.g., mono-, di-, and tricaboxylic acids) and surface-active agent(s) that promote surface wetting. In one embodiment, a non-acidic resin in the form of a pentaerythritol ester of hydrogenated rosin is used. In other embodiments, the resin can be a rosin.

The flux can be applied to a substrate to clean the oxidation from the metallic surfaces (e.g., surfaces of copper, tin, tin-silver, tin-lead, palladium, etc.) and to protect the surfaces from further oxidation. The water can then be evaporated from the flux, followed by application of solder (e.g., via a wave soldering process) to the flux and use of the solder to secure an electronic component to the substrate. The flux residues need not be removed from the board before the board is put into use in an electronics application.

Various embodiments of these soldering fluxes offer numerous advantages over those known in the art. In particular, many advantages can be derived from the use of fluxes that are free of volatile organic compounds.

For example, basic nitrogen compounds, particularly amines (volatile and/or non-volatile at soldering temperatures), that have been used in known flux compositions tend to be flammable, and noxious if volatile and, accordingly, present numerous health and environmental hazards. Further, if the basic compounds that are used are non-volatile, they can react with the acidic resins and metallic ions to produce residues in the form of rosin soaps and metal salts, which are hygroscopic and conductive and, if left on the soldered circuits, can compromise the surface insulation of the PCB assembly. Moreover, in hot and humid environments, these residues absorb moisture, which promotes dendritic growth, which, in turn, causes current leakage. Consequently, an extra step is generally needed after soldering to completely eliminate the residues of the basic compound from the PCB. This post-soldering cleaning is often performed with a cleaning agent (e.g., a chlorofluorocarbon or other organic solvent mixtures), which, itself, presents environmental hazards. Yet another disadvantage of using amines in accordance with known teachings is that these amines can react with an organic acid activator in the flux solution. To offset the loss due to this reaction, relatively large quantities of amines may be needed to provide a stable solution.

Fluxes that are free or substantially free of amines, such as those described herein, can avoid or ameliorate each of these problems. Consequently, flux residues can remain on the board without compromising the electrical reliability of the circuit assemblies, thereby eliminating the need to either wash the flux residues from the board surface or cover the residues with a conformal coating.

Further, fluxes that are also free or substantially free of volatile organic solvents that are typically used in known fluxes also remove or minimize the health and environmental hazards associated with those components. By eliminating the presence of both the amines (volatile or non-volatile) and the volatile organic compounds (solvents) from the flux, as described herein, many of these problems can be entirely or substantially eliminated.

Additionally, the fluxes described herein can provide a high grade of solderability. The term, "solderability," as used herein, refers to an ability to provide a clean metallic surface on the substrate, as well as on the component leads, so that a high degree of wetting and coalescence of molten solder on the PCB surface can be achieved.

DETAILED DESCRIPTION

The soldering fluxes of this disclosure are aqueous compositions comprising one or more dispersed resins. The fluxes typically also include activating agent(s) and surface-active agent(s) that promote surface wetting. The flux can easily be prepared by the addition of appropriate proportions of resin dispersion, activators and surfactants to water at room temperature along with other property-enhancing additives, and mixing to form an aqueous solution. The end composition is 70 to 97% water by weight. Preferred embodiments include fluxes in which the range of water is 90 to 96% by weight of the flux.

In particular embodiments, the resin is a pentaerythritol ester of hydrogenated rosin, commercially available in the form of an aqueous dispersion, known as PENTALYN H-55WBX resin dispersion (available from Hercules, Inc., Wilmington, Del., USA). Examples of other resins that can be used, and which are also available in the form of aqueous dispersions, include TACOLYN 1065 resin dispersion, TACOLYN 1070 resin dispersion and FORAL 85-55WKX resin dispersion (each of which is also available from Hercules, Inc., Wilmington, Del., USA). The resin solid forms 0.1 to 15%, by weight, of the flux, with a preferred range of 0.1 to 10%, by weight, resin solid in the flux. The preferred range can be formed by adding between about 0.2 to about 18.2%, by weight, resin dispersion (55% solid resin) to the aqueous composition.

Unlike resins used in known aqueous fluxes, such as those disclosed in U.S. Pat. No. 5,863,355, which teaches that the resin used in its flux preferably has an acid number of at least 180, the resins listed in the preceding paragraph have no acid number, i.e., are non-acidic. "Acid number" is a measure of the free acid content of a substance, as determined by the number of milligrams of potassium hydroxide (KOH) required to neutralize one gram of the substance.

A particular benefit of the use of such non-acidic resins is that these water-based soldering flux compositions can be substantially free of volatile organic compounds and volatile basic compounds because the non-acidic resins described herein are dispersed in water without the use of volatile organic compounds such as solvents and/or amines. Though trace quantities of these compounds may be present in the flux either as contaminants or as minor components of any of the additives (a minor component in a surfactant, for example), the flux, as a whole, is still considered for purposes of this disclosure to be substantially and essentially free of volatile organic and basic compounds (less than 1% by weight). By freeing the flux composition of non-volatile amines, residues of the flux composition can remain on the printed circuit board without having either (a) to wash the residues from the surface of the board or (b) to provide a conformal coating (e.g., in the form of a moisture barrier layer) over the flux residue to prevent shorting or corrosion of the printed circuits. Rather, the flux layer, itself, acts as a protective layer. However, if flux removal is desired, non-flammable, low-VOC, solvent cleaning compositions can be applied to remove the flux. Further, if the added protection of a conformal coating is desired, a coating of, for example, urethane, silicone or paralyn can be applied.

The activator system of the flux includes one or more water-soluble organic acids and/or ionic or non-ionic halides. "Activators" are chemicals that, when added to the flux, enable the flux to remove oxides from the metal surfaces to be soldered. It is advantageous to select activators that exhibit sufficient solubility in water to remain fully in solution after one or more freezing/thawing cycles of the flux. More particularly, should the flux be frozen during transportation or storage, the use of such activators ensures that the flux will be in solution form after thawing, whereby it is still effective for use. Generally speaking, solubility in water of at least about 5 grams per 100 $cm^3$ at 20° C. (68° F.) will be sufficient for this purpose. Activators of low solubility do not offer the foregoing advantage, because they drop out and remain out of solution when the flux is subjected to a freeze/thaw cycle, whereby the flux cannot be used without further processing (such as by heating the flux sufficiently above room temperature to restore the solution).

The total activator content of the flux is between about 0.2 and about 8% by weight of the flux. Lower activator content may not provide sufficient fluxing activity, while a higher activator content may result in excessive residues, which could adversely affect the finished soldered assembly. Of course, as between stronger and weaker activators, stronger activators should be used in amounts more toward the lower end of the indicated range. In particular embodiments, the activator content is from 0.5 to about 4% by weight of the flux.

Examples of activators suitable for use in the present invention include organic activators such as carboxylic acids, sulfonic acids, phosphonic acids, phosphate esters, amino acids, alkanolamines, and combination thereof. Such activators are only weakly ionic relative to halide-containing activators, such as amine hydrohalides (e.g., amine hydrochlorides and amine hydrobromides) commonly used in the electronics industry. Moreover, being halide-free, these activators do not lead to the regenerative corrosion reaction which takes place when halides are present.

Specific chemicals that are suitable for use as activators include succinic acid ($C_4H_6O_4$), itaconic acid ($C_5H_6O_4$); adipic acid ($C_6H_{10}O_4$); glutaric acid ($C_5H_8O_4$); and non-ionic halide compounds such as trans-2,3-Dibromo-2-butene-1,4-diol; meso-2,3-Dibromosuccinic acid; 5-Bromosalicylic acid; 3,5-Dibromosalicylic acid and other water-soluble mono and dibromo compounds. Additional examples of carboxylic acids and other activators suitable for inclusion in the flux are described in U.S. Pat. No. 5,297,721, and in U.S. Pat. No. 5,571,340, both of which are herein incorporated by reference in their entirety.

Surface wetting may be promoted by the addition of one or more anionic surfactants or other water-soluble surface-active agents. Examples of suitable surface-active agents include fluorinated surfactants as well as nonionic, cationic and amphoteric surfactants. Fluorinated surfactants as a class are powerful surface active agents, effective at very low concentrations. In practice, the surfactant is generally present in a concentration less than 2.0%, by weight, of the flux; and, in a preferred embodiment, the surfactant concentration is not more than 1.0%, by weight, of the flux. The concentration of the surfactant should enable the flux to thoroughly wet the surfaces to be soldered, while not contributing substantially to the level of flux residues that will be left behind after soldering. Nonionic, cationic and amphoteric surfactants can also be used. Together, the activator system and surfactants clean the surfaces to which flux is applied.

The soldering flux can additionally comprise small amounts of ingredients that enhance various properties and do not materially affect the basic properties of the flux. Such ingredients include, but are not limited to, biocides, corrosion inhibitors, dyes, foaming agents, de-foaming agents and stabilizers. The aggregate concentration of these additional ingredients is generally less than 1% by weight of the flux. The use of such ingredients is well known to those skilled in the art.

In a soldering process, leads of leaded electrical components are passed through holes in the board and placed in contact with conductive contacts on the other side of the board, and/or lead less chip components are mounted on the bottom side of the board with an adhesive. The soldering flux can then be applied to the board by spray or wave methods. The flux is applied so as to coat the surface of the board and to remove oxides and prevent cleaned metallic surfaces from re-oxidation and hence prepare the surfaces to be joined to produce defect-free solder joints. During preheat, the water component of the flux is evaporated; and during soldering, the resin emulsion breaks down and forms a hard, non-tacky, hydrophobic resinous layer that encapsulates the ionic activator residues. The result is a flux coating or fihn with high surface insulation resistance, which promotes the reliability of electrically conductive solder connections. This process is similar to that used with conventional solvent-based RMA, rosin-mild-activated, and RA, rosin-activated, type fluxes.

EXAMPLES

Compositions of particular soldering fluxes of this disclosure are as follows:

Example 1

| Flux composition | % by weight |
| --- | --- |
| Water | 93.00 |
| Succinic acid | 1.50 |
| Itaconic acid | 1.50 |
| TRITON N-101 surfactant | 0.03 |
| N-Octyl pyrrolidone | 0.02 |
| SURFYNOL 104PG50 surfactant | 0.10 |
| UCARCIDE 250 antimicrobial | 0.20 |
| PENTALYN H-55WBX resin dispersion | 3.65 |

In the composition of Example 1, succinic acid and itaconic acid serve as activators; TRITON N-101 surfactant is nonylphenoxyppolyethoxyethanol, made by Rohm & Haas (Philadelphia, Pa., USA); n-octyl pyrrolidone is an additive that modifies the surface active properties of the flux and reduces the size of the flux drops, which produces finer mist during spray applications, which, in turn, leads to better coverage of the board surfaces when flux is applied by a spray fluxer; SURFYNOL 104PG50 surfactant, made by Air Products (Allentown, Pa., USA), is a 50% solids solution of tetramethyl decyne diol in propylene glycol, the solution serving as a wetting agent and defoamer; and UCARCIDE 250 antimicrobial is a 50% aqueous solution of Glutaraldehyde, made by Union Carbide (Danbury, Conn., USA). Further, as noted above, the component, PENTALYN H-55WBX synthetic resin dispersion, which is made by Hercules Inc., is an aqueous, 55%-solids, anionic dispersion of pentaerythritol ester of hydrogenated rosin; it serves as the non-acidic resin of the flux.

Example 2

| Flux composition | % by weight |
| --- | --- |
| Water | 93.65 |
| Succinic acid | 2.00 |
| Dibromobutene diol | 0.50 |
| PENTALYN H-55WBX resin dispersion | 3.65 |
| FLUOWET OTN surfactant | 0.15 |

In the composition of Example 2, dibromobutene diol is an activator, and the component, FLUOWET OTN surfactant, is a fluoro-surfactant made by Clariant Corp. (Mt. Holly, N.C., USA). The other components function as described in Example 1.

Example 3

| Flux composition | % by weight |
| --- | --- |
| Water | 93.32 |
| Adipic acid | 2.00 |
| Dibromobutene diol | 0.50 |
| PENTALYN H-55WBX resin dispersion | 3.65 |
| ZONYL FSN surfactant | 0.18 |
| UCARCIDE 250 antimicrobial | 0.20 |
| Hydroxybenzotriazole | 0.15 |

In the composition of Example 3, adipic acid is an activator; the component, ZONYL FSN surfactant, is a fluoro-surfactant (perfluoroalkyl ethoxylate) made by Du Pont (Wilmington, Del., USA); hydroxybenzotriazole serves as a corrosion inhibitor. The remaining components function as in the previous examples.

Example 4

| Flux composition | % by weight |
| --- | --- |
| Water | 91.92 |
| Succinic acid | 2.00 |
| Glutaric acid | 2.00 |
| PENTALYN H-55WBX resin dispersion | 3.64 |
| ZONYL FSN surfactant | 0.18 |
| UCARCIDE 250 antimicrobial | 0.20 |
| N-Octyl pyrrolidone | 0.06 |

In this example, glutaric acid serves as an activator, along with the succinic acid. Each of the other components functions as in the previous examples.

Example 5

| Flux composition | % by weight |
| --- | --- |
| Water | 93.92 |
| Glutaric acid | 1.00 |
| Succinic acid | 1.00 |
| ZONYL FSN surfactant | 0.18 |
| UCARCIDE 250 antimicrobial | 0.20 |
| N-Octyl pyrrolidone | 0.06 |
| PENTALYN H-55WBX resin dispersion | 3.64 |

Example 6

| Flux composition | % by weight |
| --- | --- |
| Water | 93.92 |
| Glutaric acid | 1.00 |
| Succinic acid | 1.00 |
| ZONYL FSN surfactant | 0.18 |
| UCARCIDE 250 antimicrobial | 0.20 |
| N-Octyl pyrrolidone | 0.06 |
| TACOLYN 1065 resin dispersion | 3.64 |

This example differs from the previous examples in that TACOLYN 1065 resin dispersion replaces the PENTALYN H-55 WBX resin dispersion as the source of the non-acidic resin. TACOLYN 1065 resin dispersion, which is likewise made by Hercules Inc., is an aqueous, 55%-solids, solvent-free, synthetic-resin dispersion based on a moderate-softening-point, stable, low-molecular-weight thermoplastic resin.

Example 7

| Flux composition | % by weight |
| --- | --- |
| Water | 93.92 |
| Glutaric acid | 1.00 |
| Succinic acid | 1.00 |
| ZONYL FSN surfactant | 0.18 |
| UCARCIDE 250 antimicrobial | 0.20 |
| N-Octyl pyrrolidone | 0.06 |
| FORAL 85-55WKX resin dispersion | 3.64 |

This example differs from those above in that "FORAL 85-55WKX synthetic resin dispersion," which is made by Hercules Inc., supplies the non-acidic resin. FORAL 85-55WKX resin dispersion is a 55%-solids-content, anionic (ion tolerant) aqueous resin dispersion prepared from the glycerol ester of a highly hydrogenated rosin.

Example 8

| Flux composition | % by weight |
| --- | --- |
| Water | 93.92 |
| Glutaric acid | 1.00 |
| Succinic acid | 1.00 |
| ZONYL FSN surfactant | 0.18 |
| UCARCIDE 250 antimicrobial | 0.20 |
| N-Octyl pyrrolidone | 0.06 |
| TACOLYN 1070 resin dispersion | 3.64 |

In this example, the non-acidic resin is provided in the TACOLYN 1070 resin dispersion, which is an aqueous, 55%-solids, solvent-free, synthetic-resin dispersion from Hercules Inc.

Example 9

| Flux composition | % by weight |
| --- | --- |
| Water | 93.75 |
| Succinic acid | 1.80 |
| Dibromobutene diol | 0.40 |
| TACOLYN 1065 resin dispersion | 3.65 |
| FLUOWET OTN surfactant | 0.15 |
| UCARCIDE 250 antimicrobial | 0.10 |
| Hydroxybenzotrizole | 0.15 |

In this Example, as in Example 6, the TACOLYN 1065 resin dispersion supplies the non-acidic resin.

While this invention has been particularly shown and described with references to embodiments thereof, those skilled in the art will understand that various changes in form and details may be made therein without departing from the scope of the invention, as encompassed by the appended claims.

What is claimed is:
1. A soldering flux comprising:
   water;
   a non-acidic, water-insoluble resin dispersed in the water; and
   an activating agent in the water.
2. The soldering flux of claim 1, wherein the activating agent is selected from the group consisting of water-soluble organic acids and water-soluble non-ionic halides.
3. The soldering flux of claim 1, further comprising a surface-active agent that promotes surface wetting, the surface-active agent being dissolved in the water.
4. The soldering flux of claim 3, wherein the surface-active agent is an anionic surfactant.
5. A soldering flux comprising:
   water;
   a pentaerythritol ester of hydrogenated rosin in the water; and
   an activating agent in the water.
6. The soldering flux of claim 1, wherein the soldering flux is substantially free of volatile organic compounds.
7. The soldering flux of claim 1, wherein the water forms about 70 to 97%, by weight, of the flux.
8. A method for treating a printed circuit board comprising the steps of:
   providing a printed circuit board; and
   applying an aqueous flux including a non-acidic resin onto a surface of the printed circuit board to form a flux coating on the surface.
9. The method of claim 8, wherein the printed circuit board includes a metallic circuit, the flux coating protecting the metallic finish of the circuit from oxidation.
10. The method of claim 9, wherein the aqueous composition further includes an activating agent.
11. The method of claim 10, wherein the activating agent is selected from the group consisting of water-soluble organic acids and water-soluble halides.
12. The method of claim 9, wherein the aqueous flux further includes a water-soluble surface-active agent that promotes surface wetting.
13. The method of claim 12, wherein the surface-active agent is an anionic surfactant.
14. The method of claim 9, wherein the resin is a pentaerythritol ester of hydrogenated rosin.
15. The method of claim 9, wherein the aqueous flux is substantially free of volatile organic compounds at the time of application.
16. The method of claim 9, further comprising the steps of:
   evaporating the water from the aqueous flux;
   applying solder to the flux coating; and
   securing an electronic component to the printed circuit board with the solder.
17. The method of claim 16, wherein the electronic component is soldered to the printed circuit board via a wave soldering process.
18. The method of claim 16, further comprising the step of using the printed circuit board in an electronics application with the flux coating remaining on the surface of the printed circuit board.
19. The method of claim 16, further comprising the steps of applying a conformal coating to the flux coating and using the printed circuit board in an electronics application with the flux coating remaining on the surface of the printed circuit board.

20. The method of claim 16, further comprising the steps of cleaning flux residues from the printed circuit board with one or more solvent cleaners and then using the printed circuit board in an electronics application.

21. A printed circuit board comprising:
    a printed circuit substrate; and
    a flux including a non-acidic resin on the substrate.

22. A soldering flux comprising:
    water;
    a resin emulsified in the water; and
    an activating agent in the water.

23. The soldering flux of claim 22, wherein the resin is a rosin.

24. The soldering flux of claim 22, wherein the soldering flux is substantially free of amines and volatile organic compounds.

25. A method for treating a printed circuit board comprising the steps of:
    providing a printed circuit board; and
    applying an aqueous flux onto a surface of the printed circuit board to form a flux coating on the surface, the aqueous flux comprising water and a resin emulsified in the water.

26. The method of claim 25, wherein the resin is a rosin.

27. The method of claim 25, wherein the soldering flux is substantially free of amines and volatile organic compounds.

28. A soldering flux of claim 1, wherein the resin dispersion is of a character that breaks down and forms a non-tacky, hydrophobic resinous layer during soldering.

29. A soldering flux of claim 22, wherein the resin emulsion is of a character that breaks down and forms a non-tacky, hydrophobic resinous layer during soldering.

* * * * *